US012701790B2

(12) United States Patent
Jhu et al.

(10) Patent No.: US 12,701,790 B2
(45) Date of Patent: Aug. 4, 2026

(54) SEMICONDUCTOR DEVICE AND METHOD FOR GENERATING INTEGRATED CIRCUIT LAYOUT

(71) Applicant: TAIWAN SEMICONDUCTOR MANUFACTURING COMPANY LTD., Hsinchu (TW)

(72) Inventors: Kuan-Jung Jhu, Hsinchu City (TW); Chun-Cheng Ku, Hsinchu County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 1030 days.

(21) Appl. No.: 17/811,085

(22) Filed: Jul. 7, 2022

(65) Prior Publication Data

US 2024/0014202 A1     Jan. 11, 2024

(51) Int. Cl.
*H10D 89/10* (2025.01)
*G06F 30/392* (2020.01)

(52) U.S. Cl.
CPC .......... *H10D 89/10* (2025.01); *G06F 30/392* (2020.01)

(58) Field of Classification Search
CPC .............................. H10D 89/10; G06F 30/392

USPC ........................................................ 716/139
See application file for complete search history.

(56) References Cited

U.S. PATENT DOCUMENTS

| | | | | |
|---|---|---|---|---|
| 10,290,643 B1* | 5/2019 | Kai | ........................ | H10B 41/27 |
| 2020/0098682 A1* | 3/2020 | Shridharan | ............ | H10B 10/12 |
| 2022/0050950 A1* | 2/2022 | Yang | ..................... | G06F 30/398 |
| 2023/0305356 A1* | 9/2023 | Jacques | ................. | G02F 1/0316 |
| 2024/0070365 A1* | 2/2024 | Alptekin | ............... | G06F 30/392 |
| 2025/0107229 A1* | 3/2025 | Miao | ................... | H10D 84/0135 |

* cited by examiner

*Primary Examiner* — Suchin Parihar
(74) *Attorney, Agent, or Firm* — WPAT LAW; Anthony King

(57) ABSTRACT

The present disclosure provides methods for generating an integrated circuit (IC) layout and a semiconductor device. The method includes providing an active region in a first layer of the IC layout, disposing a gate on the active area in a second layer extending in a first direction, disposing a first conductive segment on the active area in a third layer extending in a second direction perpendicular to the first direction, and disposing a second conductive segment on the first conductive segment in a fourth layer extending in the second direction. The second conductive segment electrically connects to the first conductive segment, and a width of the first conductive segment is different than a width of the second conductive segment.

20 Claims, 10 Drawing Sheets

30

Initialize ~210

Floorplanning ~220

Placement ~230

Clock Tree Synthesis ~240

Routing ~250

Generating a tape out file for manufacturing semiconductor devices ~260

200

VG

331

360

350

332

340

333

VD

STI

OD

STI

OD

STI

320

325

322

30

40B

40A

50

SEMICONDUCTOR DEVICE AND METHOD FOR GENERATING INTEGRATED CIRCUIT LAYOUT

BACKGROUND

Antenna effect, more formally plasma induced gate oxide damage, can potentially cause adverse yield or reliability effects during manufacture. Under present practice, the antenna effect can be fixed by limiting the length of a metal segment directly connected to the gate, and the order of the routing layer directly connected to the gate changed to the higher metal layers. This solution is known as wire jogging. However, such practice increases run-time of devices, consumes more routing resources, and inhibits performance. Therefore, an improved solution for fixing antenna effect is proposed.

BRIEF DESCRIPTION OF THE DRAWINGS

Aspects of the present disclosure are best understood from the following detailed description when read with the accompanying figures. It is emphasized that, in accordance with standard practice in the industry, various features are not drawn to scale. In fact, the dimensions of the various features may be arbitrarily increased or reduced for clarity of discussion.

DETAILED DESCRIPTION

Figure 1:
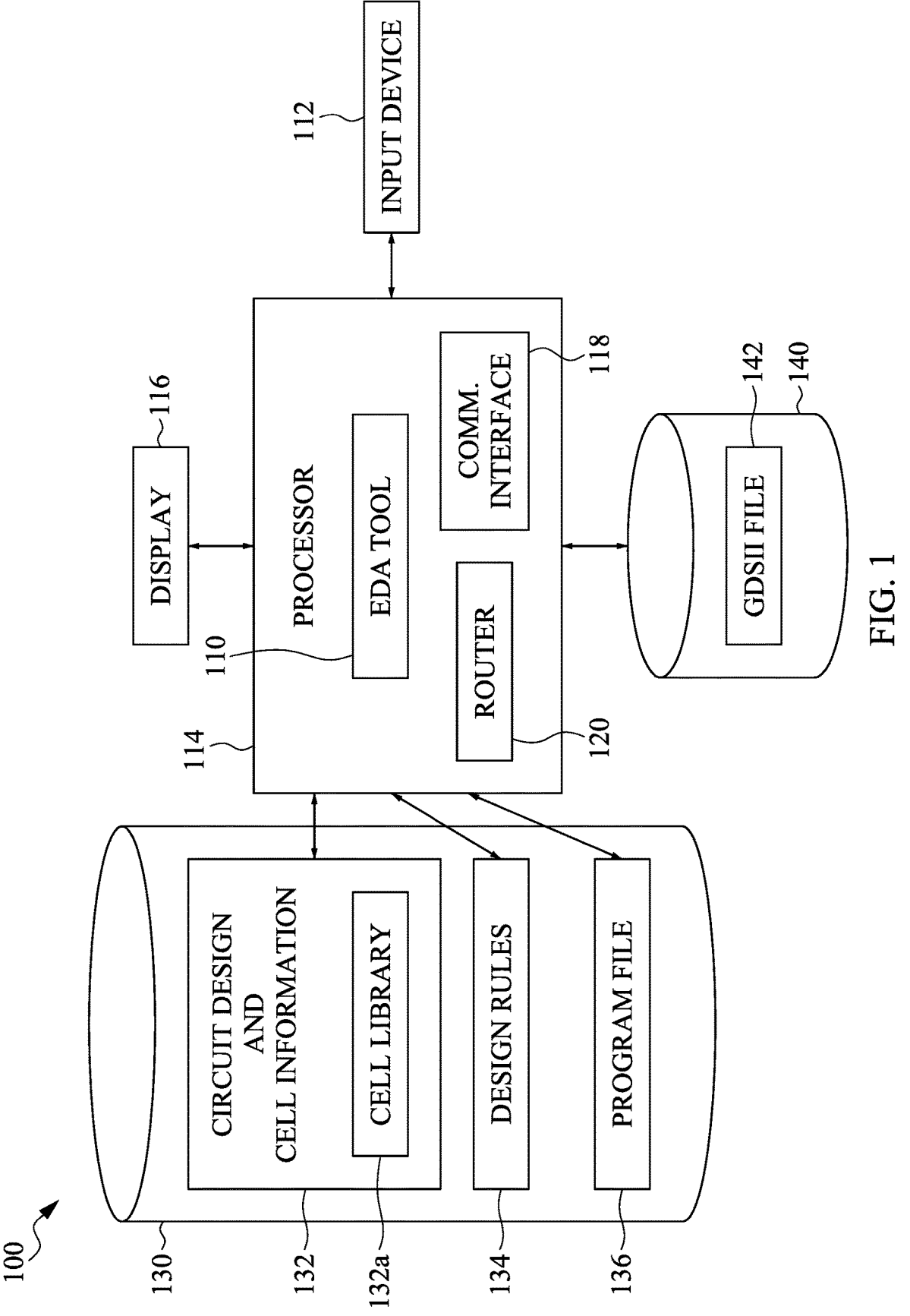
FIG. 1 is a diagram illustrating an electronic design automation system, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments, or examples, illustrated in the drawings are disclosed as follows using specific language. It will nevertheless be understood that the embodiments and examples are not intended to be limiting. Any alterations or modifications in the disclosed embodiments, and any further applications of the principles disclosed in this document are contemplated as would normally occur to one of ordinary skill in the pertinent art.

Further, it is understood that several processing steps and/or features of a device may be only briefly described. Also, additional processing steps and/or features can be added, and certain of the following processing steps and/or features can be removed or changed while still implementing the claims. Thus, it is understood that the following descriptions represent examples only, and are not intended to suggest that one or more steps or features are required.

In addition, the present disclosure may repeat reference numerals and/or letters in the various examples. This repetition is for the purpose of simplicity and clarity and does not in itself dictate a relationship between the various embodiments and/or configurations discussed.

FIG. 1 is a diagram illustrating an electronic design automation system 100 in accordance with some embodiments. As shown in FIG. 1, system 100 includes an electronic design automation ("EDA") tool 110 having a place and route tool including a chip assembly router 120.

The EDA tool 110 is a special purpose computer configured to retrieve stored program instructions 136 from a computer readable storage medium 130 and 140 and execute the instructions on a general purpose processor 114. Processor 114 may be any central processing unit ("CPU"), microprocessor, micro-controller, or computational device or circuit for executing instructions. The non-transitory computer readable storage medium 130 and 140 may be a flash memory, random access memory ("RAM"), read only memory ("ROM"), or other storage medium. Examples of RAMs include, but are not limited to, static RAM ("SRAM") and dynamic RAM ("DRAM"). ROMs include, but are not limited to, programmable ROM ("PROM"), electrically programmable ROM ("EPROM"), and electrically erasable programmable ROM ("EEPROM"), to name a few possibilities.

System 100 may include a display 116 and a user interface or input device 112 such as, for example, a mouse, a touch screen, a microphone, a trackball, a keyboard, or other device through which a user may input design and layout instructions to system 100. The one or more computer readable storage mediums 130 and 140 may store data input by a user such as a circuit design and cell information 132, which may include a cell library 132*a*, design rules 134, one or more program files 136, and one or more graphical data system ("GDS") II files 142.

EDA tool 110 may also include a communication interface 118 allowing software and data to be transferred between EDA tool 110 and external devices. Examples of a communications interface 118 include, but are not limited to, a modem, an Ethernet card, a wireless network card, a Personal Computer Memory Card International Association ("PCMCIA") slot and card, or the like. Software and data transferred via communications interface 118 may be in the form of signals, which may be electronic, electromagnetic, optical, or the like that are capable of being received by communications interface 118. These signals may be provided to communications interface 118 via a communications path (e.g., a channel), which may be implemented using wire, cable, fiber optics, a telephone line, a cellular link, a radio frequency ("RF") link and other communication channels. The communications interface 118 may be a wired link and/or a wireless link coupled to a local area network (LAN) or a wide area network (WAN).

Router 120 is capable of receiving an identification of a plurality of cells to be included in a circuit layout, including a list 132 of pairs of cells. The plurality of cells can be connected to each other. In some embodiments, the list 132 can be selected from the cell library 132*a*. Design rules 134 may be used for a variety of processing technologies. In some embodiments, the design rules 134 configure the router 120 to locate connecting lines and vias on a manufacturing grid. Other embodiments may allow the router to include off-grid connecting lines and/or vias in the layout.

Figure 2:
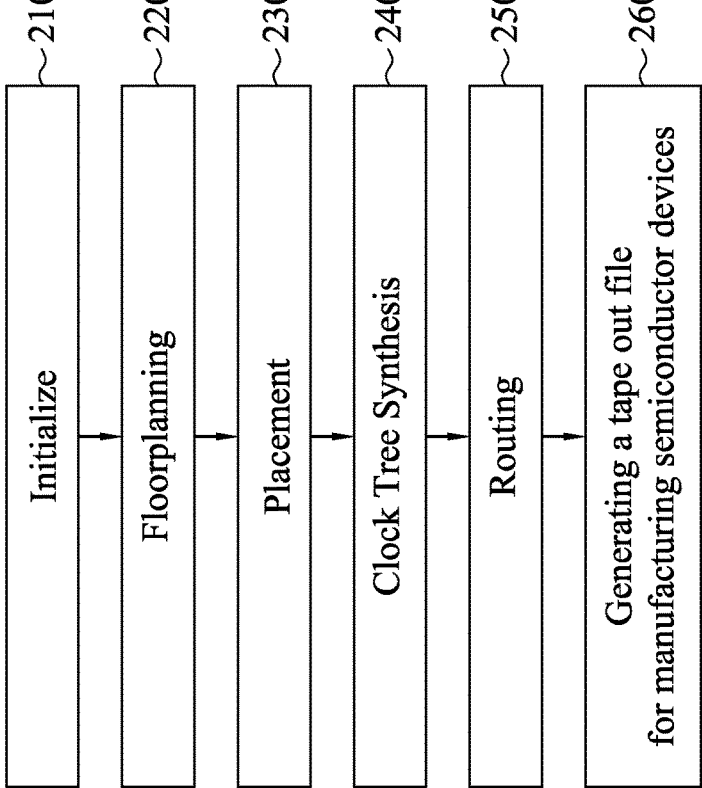
FIG. 2 is a flowchart showing a method for generating an integrated circuit design layout, in accordance with some embodiments of the present disclosure.
Figure 2:

FIG. 2 is a flowchart 200 showing a method for generating an integrated circuit design layout, in accordance with some embodiments of the present disclosure. In some embodiments, this method may correspond to an automatic placement and routing (APR) process. In some embodiments, the APR process of the present disclosure may be applied to any suitable integrated circuit design layout.

The APR process shown in FIG. 2 may begin in operation 210, initializing a pre-placement of an integrated circuit design layout. For example, the pre-placement simulation may be generated according to design data corresponding to an integrated circuit layout stored in a data storage device. In some embodiments, the pre-placement simulation may be executed on the design, e.g., by an EDA tool, to determine whether the design meets a predetermined specification. If the design does not meet the predetermined specification, the semiconductor device is redesigned. In some embodiments, a SPICE simulation is performed on the SPICE netlist. Other simulation tools can be employed, in place of or in addition to the SPICE simulation, in other embodiments.

In operation 220, floor planning for the integrated circuit is performed, for example, by system 100. In some embodiments, floor planning includes dividing a circuit into functional blocks, which are portions of the circuit, and identifying the layout for these functional blocks.

In operation 230, an automated placement tool may create a transistor level design by placing cells from a cell library to form the various logic and functional blocks according to the IC design. In some embodiments, the system 100 performs placement for the integrated circuit.

In some embodiments, operation 230 includes determining the placement for the electronic components, circuitry, and logic elements. For example, the placement of the transistors, resistors, inductors, logic gates, and other elements of the integrated circuit can be selected in operation 230.

In operation 240, Clock Tree Synthesis (CTS) may be performed after the placement of cells. In some embodiments, a CTS tool synthesizes a clock tree for the entire integrated circuit design layout. As it does so, the CTS tool establishes only an approximate position for each buffer forming the clock tree and only approximates the routing of signal paths that will link the buffers to one another and to synchronization, so that it can make reasonably accurate estimates of signal path delays through the clock tree.

In operation 250, an automatic routing tool then determines the connections needed between the devices in the cells, such as MOS transistors. Multiple transistors are coupled together to form functional blocks, such as adders, multiplexers, registers, and the like, in the routing step. Routing comprises the placement of signal net wires on a metal layer within placed cells to carry non-power signals between different functional blocks. In some embodiments, signal net wires are routed on the same metal level as one of the vertically adjacent metal layers in the multilevel power rails.

Once the routing is determined, automated layout tools are used to map the cells and the interconnections from the router onto a semiconductor device using the process rules and the design rules, as provided. All of these software tools are available commercially for purchase. Cell libraries that are parameterized for certain semiconductor wafer manufacturing facilities are also available.

In operation 260, a tape out data file corresponding to an integrated circuit layout of a semiconductor device may be generated. In some embodiments, the integrated circuit design layouts can include FinFET devices and/or other planar or more complex structural semiconductor manufacturing processes.

Figure 3A:
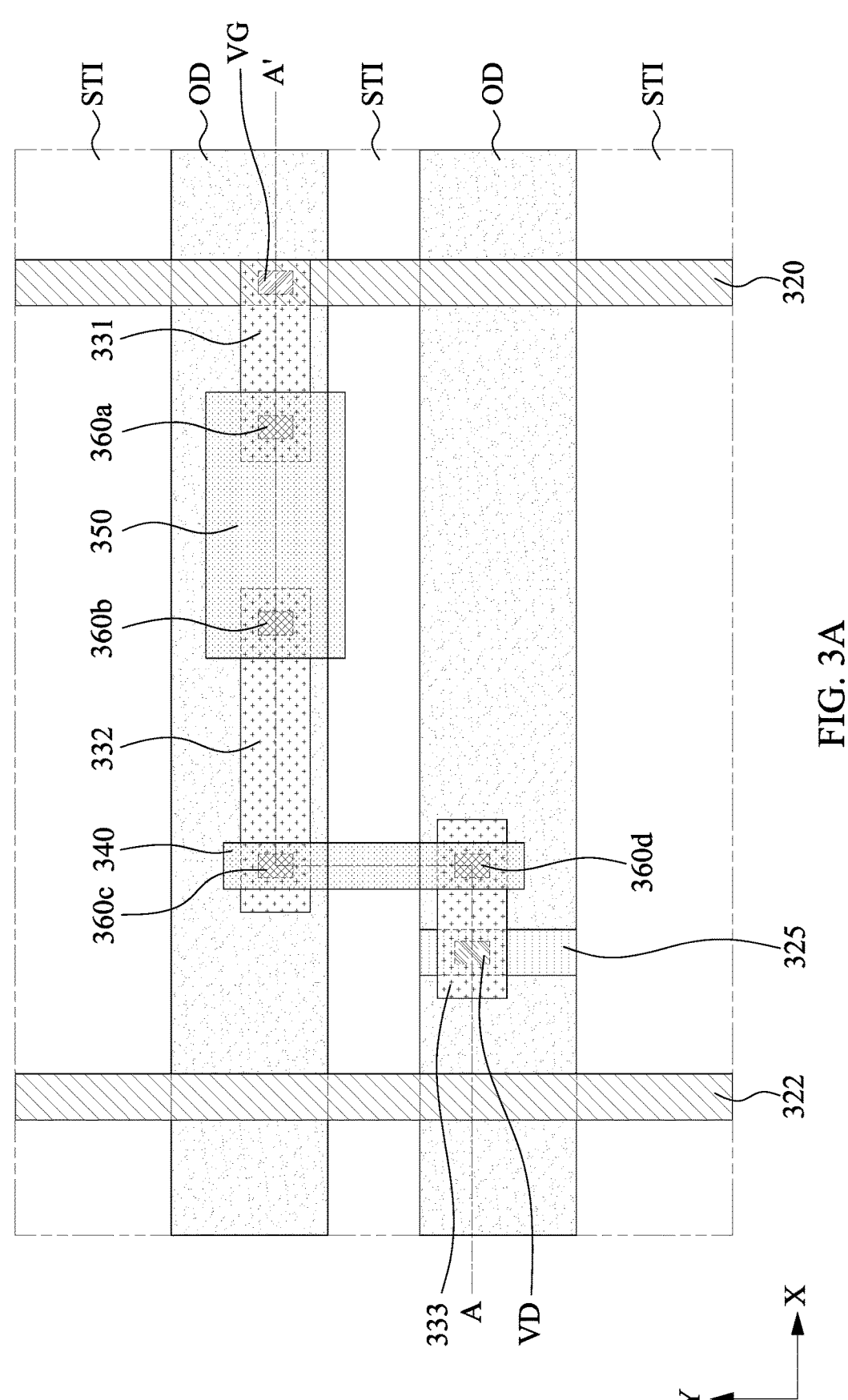
FIG. 3A is a top view of a semiconductor device, in accordance with some embodiments of the present disclosure.
Figure 3B:
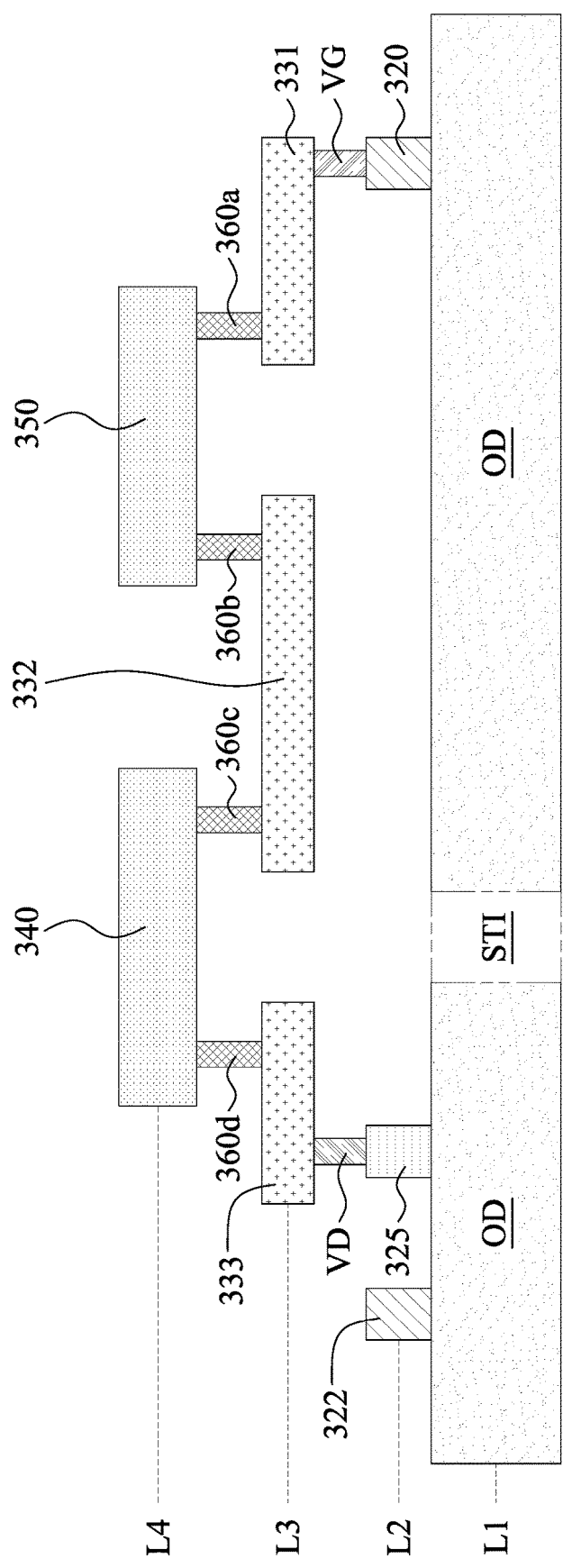
FIG. 3B is a cross-section of a semiconductor device along the section line A-A' of FIG. 3A, in accordance with some embodiments of the present disclosure.

FIG. 3A is a top view of a semiconductor device 30, in accordance with some embodiments of the present disclosure. Referring to FIG. 3A, multiple layers are illustrated and overlaid one another along with various patterns in the respective layers from a top-view perspective. The semiconductor device 30 includes active regions OD, gate electrodes (GT) 320 and 322, source/drain contact (MD) 325, conductive segments (M0) 331, 332, 333, a conductive segment (M1) 340, a jumper (M1) 350, conductive vias VG, VD, and conductive vias (V0) 360*a*. 360*b*, 360*c*, and 360*d*. The mentioned features are overlaid with each other from a top-view perspective as shown in FIG. 3A. FIG. 3B is a cross-section of a semiconductor device 30 along the section line A-A' of FIG. 3A, in accordance with some embodiments of the present disclosure. FIG. 3B shows a vertical arrangement of the patterns in the mentioned layers of the semiconductor device 30.

The semiconductor device 30 can include one or more active regions OD. In some embodiments, the active regions OD can be rectangular. Each of the active regions OD may include two source/drain regions and a channel region of a transistor (not shown) interposed between the two source/drain regions. The source/drain regions in the active region OD can be an N-type active region doped with N-type impurities such as arsenic, phosphorus, or the like, or a P-type active region doped with P-type impurities such as boron or the like. The channel region in the active region OD may be undoped or lightly doped.

In some embodiments, the active region OD can be defined and laterally surrounded by isolation structures STI. In some embodiments, the isolation structures STI are formed of dielectric materials, such as oxide or nitride, and may be referred to as shallow trench isolation. Referring to FIG. 3B, the active region OD is disposed in a layer L1. In some embodiments, the active region OD can be defined and surrounded by isolation structures STI. For example, two active regions OD may be isolated by the isolation structures STI as shown in FIG. 3B. In some embodiments, the isolation structures STI can be disposed in the layer L1.

The gate electrodes 320 and 322 are disposed in a layer L2 above the layer L1. The gate electrodes 320 and 322 can be disposed on the active regions OD. In some embodiments, the gate electrodes 320 and 322 can extend vertically from the top view perspective. The gate electrodes 320 and 322 may be formed of a conductive material, such as doped polysilicon. In some embodiments, the gate electrodes 320 and 322 can be formed of a metal gate comprising metallic materials, such as tungsten, and cobalt, and other work function adjusting metals, such as Ti, Al, TiAl, TiN, TaC, and the like. Although not explicitly shown in FIG. 3A, a gate dielectric film formed of dielectric materials may be arranged between the channel region and the gate electrodes GT 320 and 322. In some embodiments, the layers L1 and L2 in which the active regions OD and gate electrodes 320 and 322 located may be collectively referred to as a transistor layer.

The source/drain contact (MD) 325 can be disposed in the layer L2. The source/drain contact (MD) 325 can be disposed on the active regions OD. The source/drain contact (MD) 325 can be located adjacent to the gate electrodes 320 and 322. In some embodiments, the source/drain contact (MD) 325 is located in a layer identical to that of the gate electrodes GT 320 and 322. The source/drain contact (MD) 325 may be arranged parallel to the gate electrodes GT 320 and 322 from the top view perspective. The source/drain contact (MD) 325 can extend in the same direction as the gate electrodes GT 320 and 322. In other words, the source/drain contact (MD) 325 extends vertically from the top view perspective. The source/drain contact (MD) 325 may be formed of conductive materials, such as copper, tungsten, aluminum, titanium, tantalum, alloys thereof, or the like. In some embodiments, each of the source/drain regions in the active region OD may include one or more source/drain contacts (MD) disposed thereon. For clarity, only one source/drain contact (MD) 325 is illustrated in FIG. 3A.

In some embodiments, the semiconductor device 30 can include one or more conductive segments M0. The conductive segments M0 can be arranged in a pattern. Referring to FIG. 3A, the semiconductor device 30 can include three conductive segments M0 331, 332, and 333. The conductive segments M0 331, 332, and 333 are disposed in a layer L3 above the layer L2 as shown in FIG. 3B. The layer L2 is between the layers L1 and L3. The conductive segments M0 331, 332, and 333 are disposed on the gate electrodes 320 and 322. The conductive segments M0 331, 332, and 333 are disposed on the source/drain contact (MD) 325. In some embodiments, the conductive segments M0 331, 332, and 333 can be disposed on the active regions OD. The conductive segments M0 331, 332, and 333 can extend perpendicular to the gate electrodes 320 and 332. That is, the conductive segments M0 331, 332, and 333 can extend horizontally from the top view perspective.

In some embodiments, the conductive segments 331 can be aligned with the conductive segment 332. In another embodiments, the conductive segments 331 can be misaligned with the conductive segment 333. The conductive segment 332 can be misaligned with the conductive segment 333. The conductive segments 331, 332, and 333 extend parallel to each other. The conductive segments M0 331, 332, and 333 may be formed of conductive materials, such as copper, tungsten, aluminum, titanium, tantalum, alloys thereof, or the like. In some embodiments, the conductive segment 331 can electrically connect to the gate electrode 320. In some embodiments, the conductive segment 333 can electrically connect to the source/drain contact (MD) 325.

Referring to FIG. 3B, the conductive vias VG and VD are disposed between the layers L2 and L3. In some embodiments, the conductive via VG is disposed on the gate electrode 320. The conductive segment 331 can be electrically connected to the gate electrode 320 through the conductive via VG. In some embodiments, the conductive via VD is disposed on the source/drain contact (MD) 325. The conductive segment 333 can be electrically connected to the source/drain contact (MD) 325 through the conductive via VD.

The conductive vias VG and VD may be formed of conductive materials, such as copper, tungsten, aluminum, titanium, tantalum, alloys thereof, or the like. The numbers of conductive segments and conductive vias shown in FIG. 3A are for illustrative purposes only. Other numbers of layers, materials, and configurations of the semiconductor device are within the contemplated scope of the present disclosure.

The semiconductor device 30 can include one or more conductive segments M1. The conductive segments M1 can be arranged in a pattern. Referring to FIG. 3A, the semiconductor device 30 can include one conductive segment M1 340. The conductive segment M1 340 is disposed in a layer L4 above the layer L3 as shown in FIG. 3B. The layer L3 is between the layers L2 and L4. The conductive segment M1 340 is disposed on the gate electrodes 320 and 322. In some embodiments, the conductive segment M1 340 can be disposed on the active regions OD. The conductive segment 340 may be disposed on the conductive segments M0 331, 332, and 333. In some embodiments, in the cross-section, the conductive segments M0 331, 332, and 333 can be disposed between the gate electrodes GT 320 and 322 and the conductive segments M1.

The conductive segment M1 340 extends along the Y-axis. The conductive segment M1 340 can extend perpendicular to the axis along which the conductive segments 331, 332, and 333 extend. That is, the conductive segment M1 340 can extend vertically from the top view perspective. In some embodiments, the conductive segment M1 340 can be disposed above the conductive segments 332 and 333. In some embodiments, the conductive segment M1 340 can electrically connect the conductive segments M0 332 and 333.

The jumper 350 can be disposed in the layer L4 as shown in FIG. 3B. Referring to FIG. 3A, the jumper 350 can be a conductive segment similar to the conductive segment M1 340, differing in that the jumper 350 extends along an axis (i.e., X-axis) different from the conductive segment M1 340 and has a width different from that of the conductive segment M1 340. The jumper 350 can be disposed on the active regions OD. The jumper 350 may be disposed on the conductive segments M0 331, 332, and 333. The jumper 350 and the conductive segment M1 340 can be located in the same layer L4. In some embodiments, the jumper 350 can be level with the conductive segment M1 340.

The jumper 350 can extend perpendicular to the conductive segment M1 340 from the top view perspective. In one embodiment, the jumper 350 can extend in a direction identical to that in which the conductive segments M0 331, 332, and 333 extend. That is, the jumper 350 can extend horizontally from the top view perspective. The jumper 350 can extend along the same direction as the conductive segments in the adjacent layers (such as M0). In some embodiments, the jumper 350 can be aligned with the conductive segments M0 331 and 332. A center line of the jumper 350 can be aligned with that of the conductive segments M0 331 and 332. The jumper 350 can electrically connect the conductive segments M0 331 and 332.

Referring to FIG. 3B, the conductive vias (V0) 360a, 360b, 360c, 360d are disposed between the layers L3 and IA. In some embodiments, the conductive vias (V0) 360a, 360b, 360c, 360d are disposed on the conductive segments M0 331, 332, and 333. The conductive via 360a can electrically connect the jumper 350 to the conductive segment 331. The conductive via 360b can electrically connect the jumper 350 to the conductive segment 332. The conductive via 360c can electrically connect the conductive segment 340 to the conductive segment 332. The conductive via 360d can electrically connect the conductive segment 340 to the conductive segment 333.

The conductive vias (V0) 360a, 360b, 360c, 360d may be formed of conductive materials, such as copper, tungsten, aluminum, titanium, tantalum, alloys thereof, or the like.

The numbers of the conductive segments and conductive vias shown in FIG. 3A are for illustrative purposes only. Other numbers of layers, materials, and configurations of the semiconductor device are within the contemplated scope of the present disclosure.

In some embodiments, the semiconductor device 30 can include a conductive path between the gate electrode 320 and the source/drain contact (MD) 325 through the conductive segments 331, the jumper 350, the conductive segments 332, 340, and 333.

The jumper 350 can extend in the same direction as the conductive segments in its adjacent layers (such as M0), so the wire length of the semiconductor device 30 can be reduced, improving run-time accordingly. As well, since the order of the routing layers is changed through the jumper 350, the gate electrode 320 immediately connects to a higher metal layer (i.e., the jumper 350). The conductive segments M0 331 are sufficiently short that, with the gate electrode 320 connecting to a higher metal layer, antenna effect in the semiconductor device 30 can be avoided.

To avoid the antenna effect, the length of the conductive segment 331, which directly connects to the gate electrode 320, can be restricted. In some embodiments, the maximum length of the conductive segment, which is connected to the gate electrode only through the lower metal layer, can be derived through calculations according to design data corresponding to an integrated circuit layout stored in a data storage device.

The order of the routing layers can be changed at least through the conductive segments M0 331 and the jumper (M1) 340, so the gate electrode 320 connects immediately to a higher metal layer (for example, M1). Once the length of the conductive segment, connected to the gate electrode only through the lower metal layer, exceeds the maximum length, the conductive segment can be divided into two, and the jumper can be inserted therebetween to connect them, antenna effect can be avoided without additional routing resource.

Figure 3C:
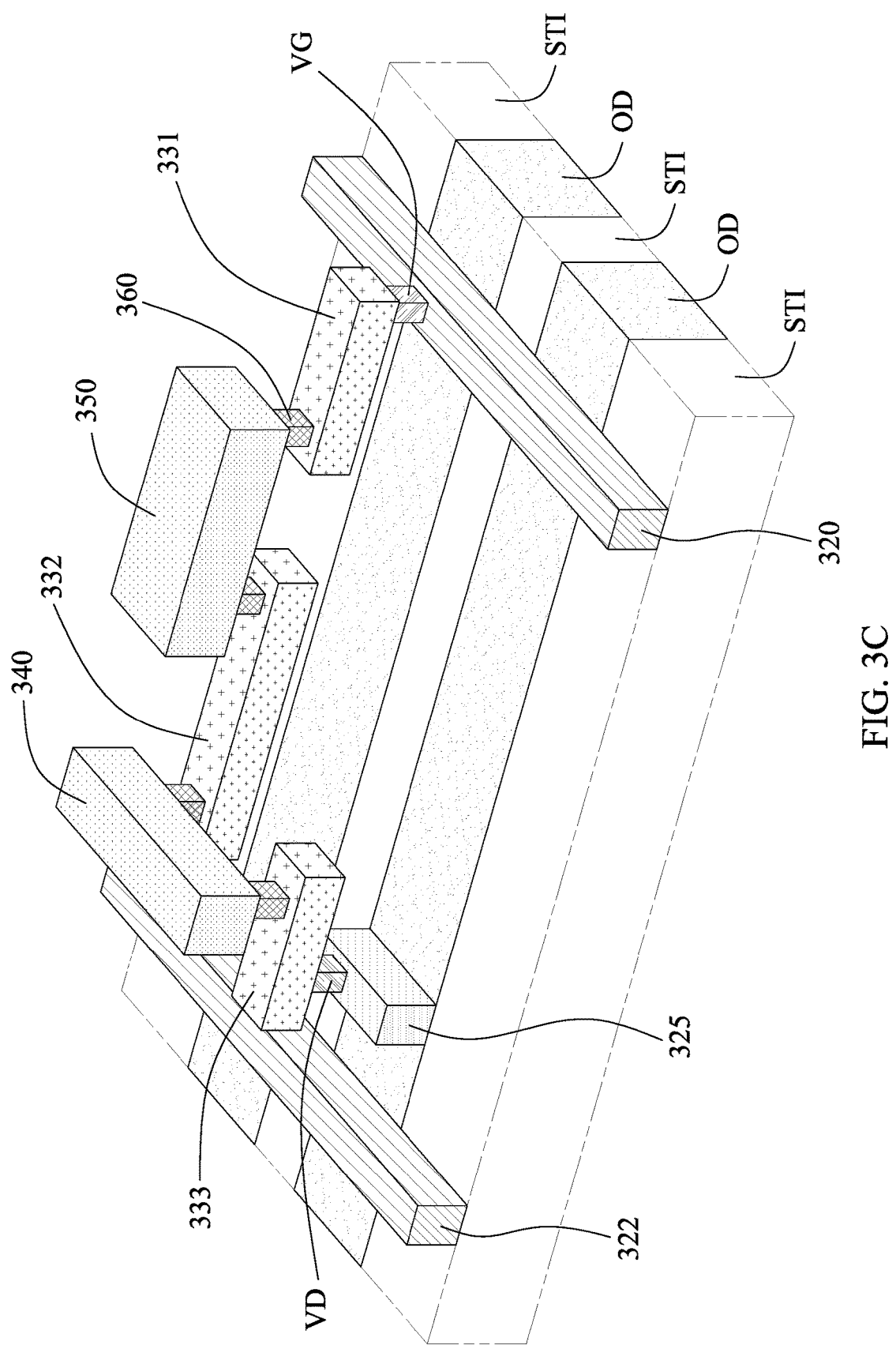
FIG. 3C is a perspective view of a semiconductor device, in accordance with some embodiments of the present disclosure.

FIG. 3C is a perspective view of a semiconductor device 30, in accordance with some embodiments of the present disclosure. The perspective view is similar to the semiconductor device 30 in many aspects, and therefore the similar descriptions are omitted for brevity. The perspective view merely illustrates the semiconductor device 30 as discussed previously. For example, the jumper 350 can be aligned with the conductive segments 331 and 332 in adjacent layers.

The layout embodiments as illustrated show the semiconductor device 30 having only four layers. However, these embodiments are provided for illustrative purposes. In other embodiments, the semiconductor devices can have more than four layers, or fewer. In some embodiments, the semiconductor devices can have more than two metal layers. Accordingly, a jumper can be inserted between any other metal layers according to needs.

Figure 4B:
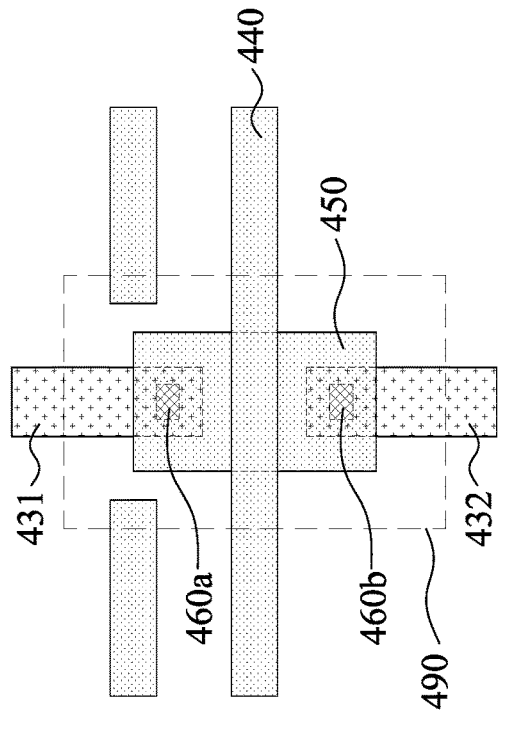
FIG. 4B is atop view of a semiconductor device, in accordance with some embodiments of the present disclosure.
Figure 4A:
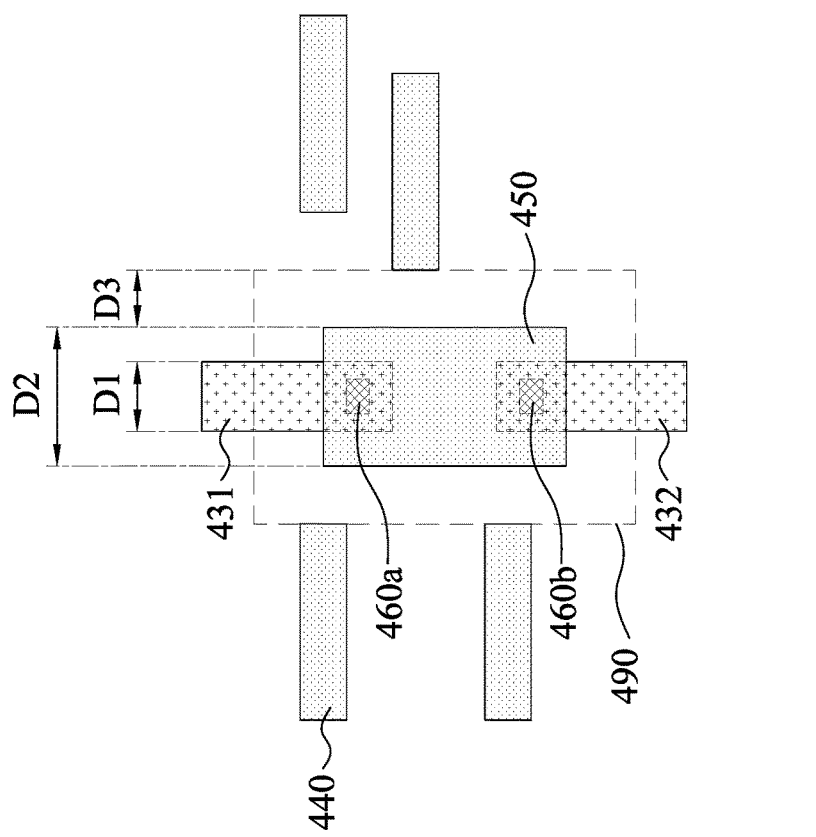
FIG. 4A is a top view of a semiconductor device, in accordance with some embodiments of the present disclosure.

FIG. 4A is a top view of a semiconductor device 40A, in accordance with some embodiments of the present disclosure. FIG. 4A merely shows the metal layers, and omits active regions, gate electrodes, etc. for brevity. The semiconductor device 40A includes conductive segments (Ma) 431 and 432, conductive segments (Ma+1) 440, a jumper 450, conductive vias (Va) 460a and 460b, and a forbidden region 490. The conductive segments (Ma) 431 and 432, the jumper 450, and conductive vias (Va) 460a and 460b can be referred to the conductive segments (M0) 331 and 332, the jumper 350, and conductive vias (V0) 360a and 360b in FIGS. 3A-3C, respectively.

The semiconductor device 40A can include one or more conductive segments (Ma+1) 440. In some embodiments, the conductive segments (Ma+1) 440 can be referred to the conductive segment (M1) 340 in FIGS. 3A-3C.

Referring to FIG. 4A, the conductive segment (Ma) 431 can have a width D1. In some embodiments, the conductive segment (Ma) 432 can have a width substantially identical to that of the conductive segment (Ma) 431. In one embodiment, the conductive segments (Ma+1) 440 may have a width substantially identical to that of the conductive segment (Ma) 431. The jumper 450 can have a width D2 different from the width D1. In some embodiments, the width D2 of the jumper 450 can be greater than the width D1 of the conductive segment 431. For example, the width D2 of the jumper 450 can be in a range of 1.5 to 2.5 times the width D1 of the conductive segment 431.

In some embodiments, the jumper 450 can have a forbidden region 490 excluding conductive segments 440 in the same layer therefrom. The forbidden region 490 for the jumper 450 prevents overlap between the jumper 450 and the conductive segments (Ma+1) 440. That is, there is no component in the forbidden region 490 in the layer in which the jumper 450 is disposed. For example, the conductive segments 440 can be disposed apart from the jumper 450 by at least a distance D3. The distance D3 can be substantially identical to a width of the conductive segments (Ma+1) 440. In some embodiments, the distance D3 can be in a range of 1.0 to 1.5 times the width of the conductive segment (Ma+1) 440. The conductive segments (Ma+1) 440 can be spaced apart from the jumper 450 by at least the distance D3 horizontally or vertically. The size of the forbidden region 490 may be predetermined in order to fulfill design rules. Accordingly, the forbidden region 490 for the jumper 450 can be considered in the APR process to avoid possible violations.

In some embodiments, the jumper 490 can be located in any metal layer, and extend along the axis of the conductive segments in the adjacent layer. The jumper 490 can be located in Ma+1 metal layer to prevent antenna effect in the adjacent metal layer Ma, which is below the Ma+1 metal layer. For example, the jumper 490 can be disposed in M3 metal layer to prevent antenna effect in the adjacent metal layer, i.e., M2 metal layer.

FIG. 4B is a top view of a semiconductor device 40B, in accordance with some embodiments of the present disclosure. The semiconductor device 40B is similar to the semiconductor device 40A in FIG. 4A, differing therefrom in that FIG. 4B shows a violation. In some embodiments, the conductive segments 440 can overlap with the jumper 450. The conductive segments 440 intersect with the jumper 450. Since the conductive segments 440 and the jumper 450 are located in the same layer, they connect to each other and thus violate the design rule of the forbidden region 490. As a result, a jumper in accordance with the present disclosure would not be placed when a conductive segment at the same level of the jumper exists in forbidden region 490.

Figure 5A:
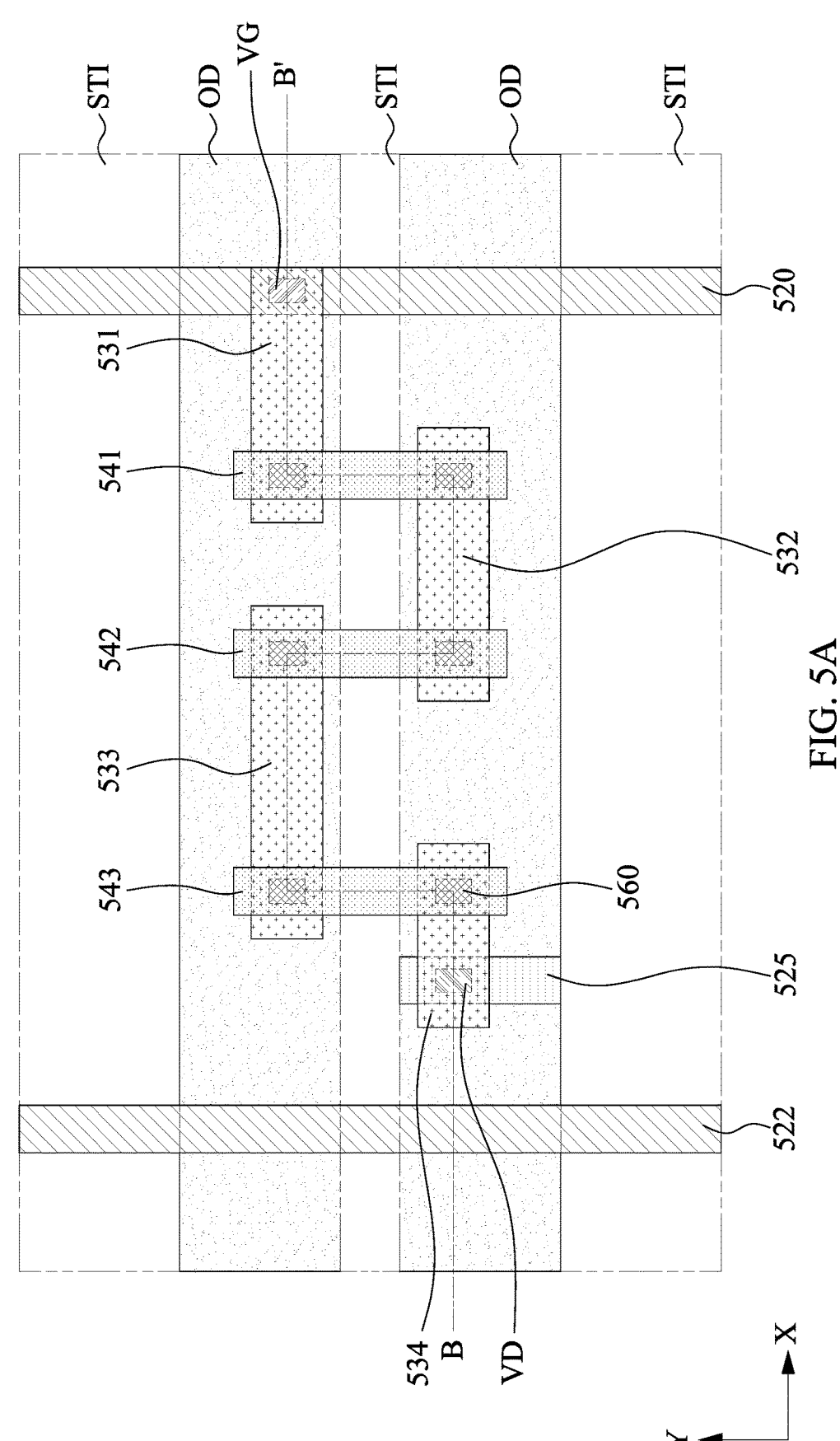
FIG. 5A is a top view of a semiconductor device, in accordance with some comparative embodiments of the present disclosure.

FIG. 5A is a top view of a semiconductor device 50, in accordance with some comparative embodiments of the present disclosure. Referring to FIG. 5A, multiple layers are illustrated and overlaid on one another along with various patterns in the respective layers from a top-view perspective.

Figure 5B:
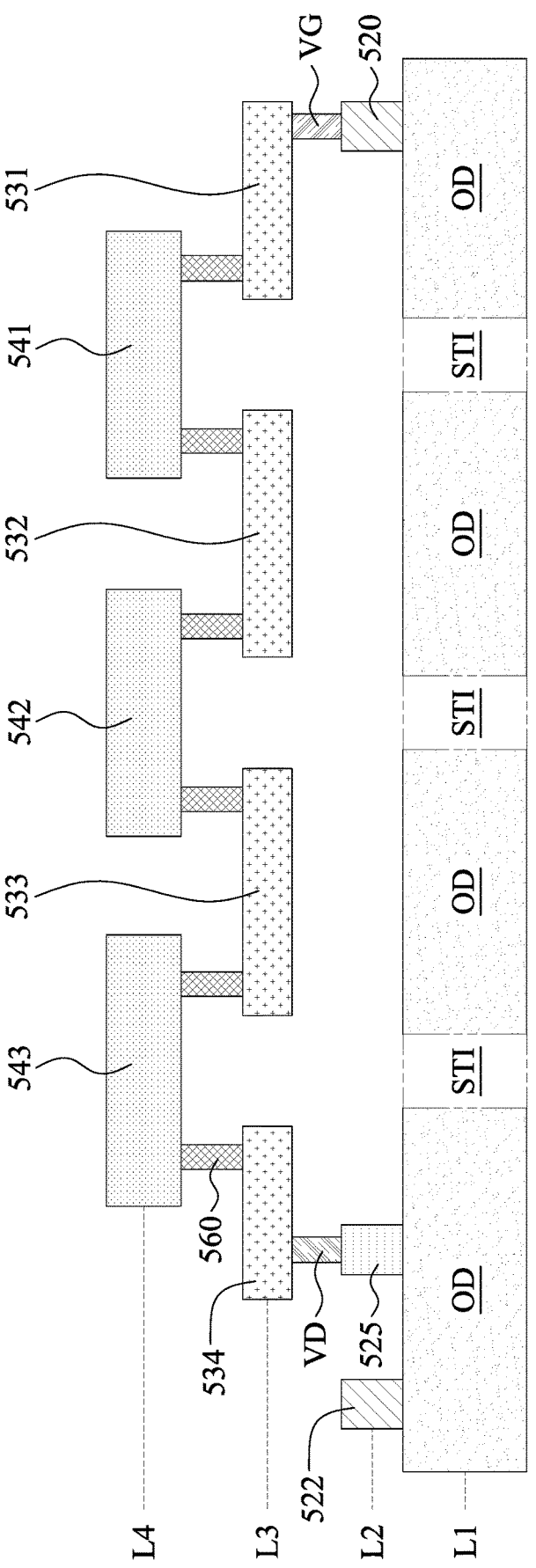
FIG. 5B is a cross-section of a semiconductor device along the section line B-B' of FIG. 5A, in accordance with some comparative embodiments of the present disclosure.

The semiconductor device 50 includes active regions OD, gate electrodes (GT) 520 and 522, source/drain contact (MD) 525, conductive segments (M0) 531, 532, 533, and 534, conductive segments (M1) 541, 542, and 543, conductive vias VG. VD, and conductive vias (V0) 560. The mentioned features are overlaid with each other from a top-view perspective as shown in FIG. 5A. FIG. 5B is a cross-section of a semiconductor device 50 along the section line B-B' of FIG. 5A, in accordance with some comparative embodiments of the present disclosure. FIG. 5B shows a vertical arrangement of the patterns in the mentioned layers of the semiconductor device 50.

The semiconductor device 50 can include one or more active regions OD. The active regions OD can be the same as described in FIG. 3A. The active region OD can be defined and laterally surrounded by isolation structures STI. In some embodiments, the isolation structures STI are formed of dielectric materials, such as oxide or nitride, and may be referred to as shallow trench isolation. Referring to FIG. 5B, the active regions OD are disposed in a layer L1. In some embodiments, the active regions OD can be defined and surrounded by isolation structures STI. For example, two active regions OD may be isolated by the isolation structures STI as shown in FIG. 5B. In some embodiments, the isolation structures STI can be disposed in the layer L1.

The gate electrodes 520 and 522 are disposed in a layer L2 above the layer L1. The gate electrodes 520 and 522 can be disposed on the active regions OD. In some embodiments, the gate electrodes 520 and 522 can extend vertically. The gate electrodes 520 and 522 may be formed of a conductive material, such as doped polysilicon. In some embodiments, the active regions OD and gate electrodes 520 and 522 may be referred to as a transistor layer.

The source/drain contact (MD) 525 can be disposed in the layer L2. The source/drain contact (MD) 525 can be disposed on the active regions OD. The source/drain contact (MD) 525 can be located adjacent to the gate electrodes 520 and 522. The source/drain contact (MD) 525 may be arranged parallel to the gate electrodes GT 520 and 522. The source/drain contact (MD) 525 can extend along the same axis as gate electrodes GT 520 and 522. In other words, the source/drain contact (MD) 525 extends vertically. In some embodiments, each of the source/drain regions in the active region OD may include one or more source/drain contact (MD) disposed thereon. For clarity, only one source/drain contact (MD) 525 is illustrated in FIG. 5A.

In some embodiments, the semiconductor device 50 can include one or more conductive segments M0. The conductive segments M0 can be arranged in pattern. Referring to FIG. 5A, the semiconductor device 50 can include four conductive segments M0 531, 532, 533, and 534. The conductive segments M0 531, 532, 533, and 534 are disposed in a layer L5 above the layer L2 as shown in FIG. 5B. The conductive segments M0 531, 532, 533, and 534 are disposed on the gate electrodes 520 and 522. The conductive segments M0 531, 532, 533, and 534 are disposed on the source/drain contact (MD) 525. The conductive segments M0 531, 532, 533, and 534 can extend perpendicular to that of the gate electrodes 520 and 552. That is, the conductive segments M0 531, 532, 533, and 534 can extend horizontally.

In some embodiments, the conductive segments 531 can be aligned with the conductive segment 533. The conductive segments 532 can be aligned with the conductive segment 534. The conductive segments 531, 532, 533, and 534 extend parallel to each other. The conductive segments M0 531, 532, 533, and 534 may be formed of conductive materials, such as copper, tungsten, aluminum, titanium, tantalum, alloys thereof, or the like. In some embodiments, the conductive segment 531 can electrically connect to the gate electrode 520. In some embodiments, the conductive segment 534 can electrically connect to the source/drain contact (MD) 525.

Referring to FIG. 5B, the conductive vias VG and VD are disposed between the layers L2 and L3. In some embodiments, the conductive via VG is disposed on the gate electrode 520. The conductive segment 531 can be electrically connected to the gate electrode 520 through the conductive via VG. In some embodiments, the conductive via VD is disposed on the source/drain contact (MD) 525. The conductive segment 533 can be electrically connected to the source/drain contact (MD) 525 through the conductive via VD.

The semiconductor device 50 can include one or more conductive segments M1. The conductive segments M1 can be arranged in pattern. Referring to FIG. 5A, the semiconductor device 50 can include conductive segments M1 541, 542, and 543. The conductive segments M1 541, 542, and 543 are disposed in a layer L4 above the layer L3 as shown in FIG. 5B. The conductive segments 541, 542, and 543 may be disposed on the conductive segments M0 531, 532, 533, and 534. In some embodiments, the conductive segments M0 531, 532, 533, and 534 can be disposed between the gate electrodes GT and the conductive segments M1 541, 542, and 543.

The conductive segments M1 541, 542, and 543 can extend perpendicular to the conductive segments M0 531, 532, 533, and 534. That is, the conductive segments M1 541, 542, and 543 can extend vertically. In some embodiments, the conductive segment M1 541 can electrically connect the conductive segments M0 531 and 532. The conductive segment M1 542 can electrically connect the conductive segments M0 532 and 533. The conductive segment M1 543 can electrically connect the conductive segments M0 533 and 534. In some embodiments, the conductive segments M1 can be electrically connected to the conductive segments M0 through the conductive vias (V0) 560.

Since the order of the routing layers is changed at least through the conductive segments M0 531 and M1 541, the gate electrode 520 connects immediately to the higher metal layer. The conductive segments M0 531 is short enough and the gate electrode 520 connects to the higher metal layer. Therefore, the antenna effect in the semiconductor device 50 can be avoided.

Figure 6:
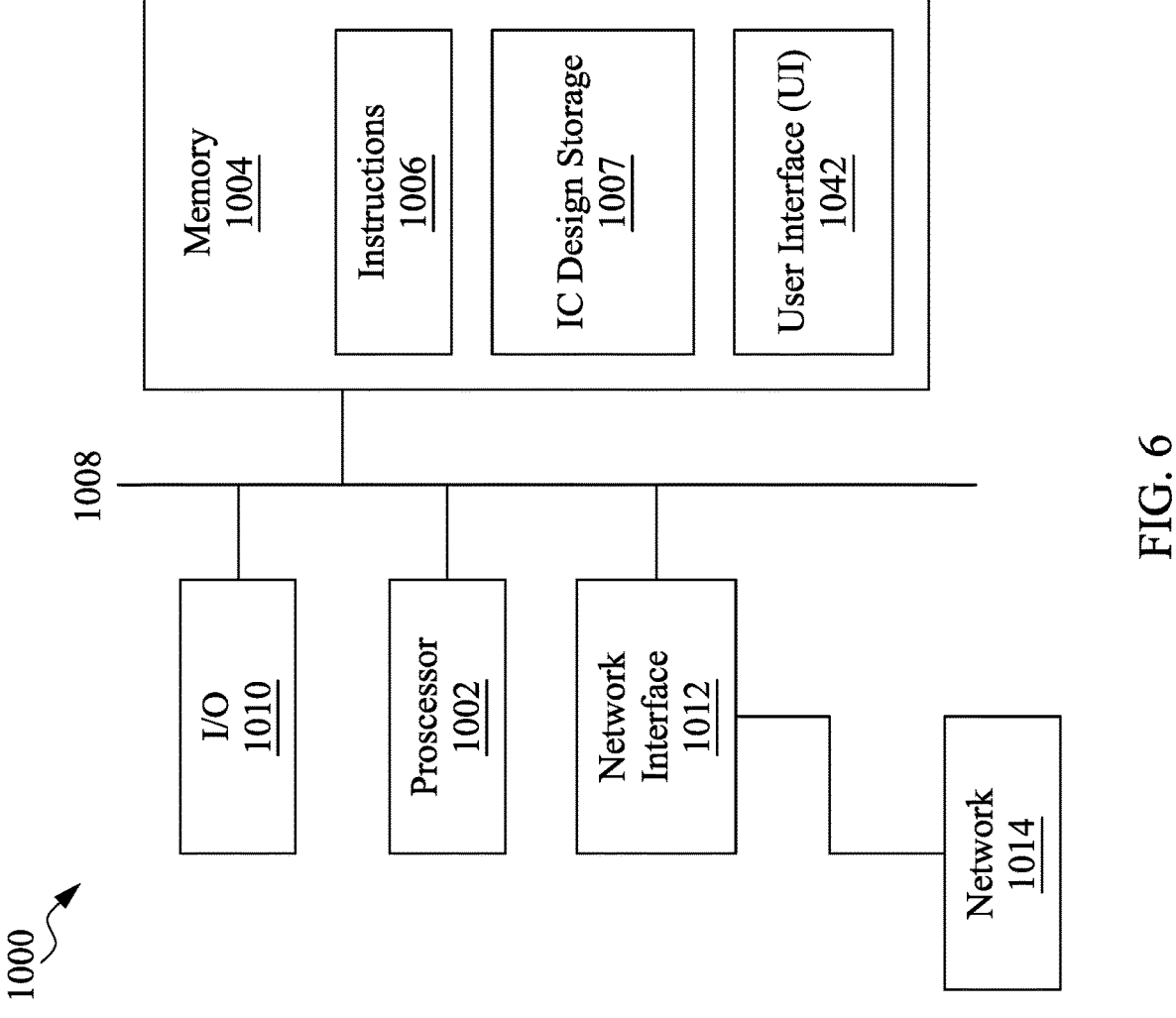
FIG. 6 is a block diagram of an IC layout diagram generation system, in accordance with some embodiments.

FIG. 6 is a block diagram of IC design system 1000, in accordance with some embodiments. Methods described herein of designing IC layout diagrams in accordance with one or more embodiments are implementable, for example, using IC design system 1000, in accordance with some embodiments. In some embodiments, IC design system 1000 can be an APR system, can include an APR system, or can be a part of an APR system, usable for performing an APR method.

In some embodiments, IC design system 1000 includes a processor 1002 and non-transitory, computer-readable memory 1004. Memory 1004, amongst other things, is encoded with, i.e., stores, computer program code, i.e., a set of executable instructions 1006. Execution of instructions 1006 by the processor 1002 represents (at least in part) an EDA tool which implements a portion or all of a method, e.g., a method of generating an IC layout diagram described above (hereinafter, the noted processes and/or methods).

Processor 1002 is electrically coupled to computer-readable memory 1004 via a bus 1008. Processor 1002 is also electrically coupled to an I/O interface 1010 by bus 1008. Network interface 1012 is also electrically connected to processor 1002 via bus 1008. Network interface 1012 is connected to a network 1014, so that processor 1002 and computer-readable memory 1004 are capable of connecting to external elements via network 1014. Processor 1002 is configured to execute instructions 1006 encoded in computer-readable memory 1004 in order to cause IC design system 1000 to be usable for performing a portion or all of the noted processes and/or methods. In one or more embodiments, processor 1002 is a central processing unit (CPU), a multi-processor, a distributed processing system, an application specific integrated circuit (ASIC), and/or a suitable processing unit.

In one or more embodiments, memory 1004 is an electronic, magnetic, optical, electromagnetic, infrared, and/or a semiconductor system (or apparatus or device). For example, memory 1004 includes a semiconductor or solid-state memory, a magnetic tape, a removable computer diskette, a random access memory (RAM), a read-only memory (ROM), a rigid magnetic disk, and/or an optical disk. In one or more embodiments using optical disks, memory 1004 includes a compact disk-read only memory (CD-ROM), a compact disk-read/write (CD-R/W), and/or a digital video disc (DVD).

In one or more embodiments, memory 1004 stores instructions 1006 configured to cause IC design system 1000 (where such execution represents (at least in part) the EDA tool) to be usable for performing a portion or all of the noted processes and/or methods. In one or more embodiments, memory 1004 also stores information which facilitates performing a portion or all of the noted processes and/or methods. In one or more embodiments, memory 1004 includes IC design storage 1007 configured to store one or more IC layout diagrams.

IC design system 1000 includes I/O interface 1010. I/O interface 1010 is coupled to external circuitry. In one or more embodiments. I/O interface 1010 includes a keyboard, keypad, mouse, trackball, trackpad, touchscreen, and/or cursor direction keys for communicating information and commands to processor 1002.

IC design system 1000 also includes network interface 1012 coupled to processor 1002. Network interface 1012 allows IC design system 1000 to communicate with network

1014, to which one or more other computer systems are connected. Network interface 1012 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more IC design systems 1000.

IC design system 1000 is configured to receive information through I/O interface 1010. The information received through I/O interface 1010 includes one or more of instructions, data, design rules, libraries of standard cells, and/or other parameters for processing by processor 1002. The information is transferred to processor 1002 via bus 1008. IC design system 1000 is configured to receive information related to a UI through I/O interface 1010. The information is stored in memory 1004 as user interface (UI) 1042.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by IC design system 1000. In some embodiments, a layout diagram which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 7:
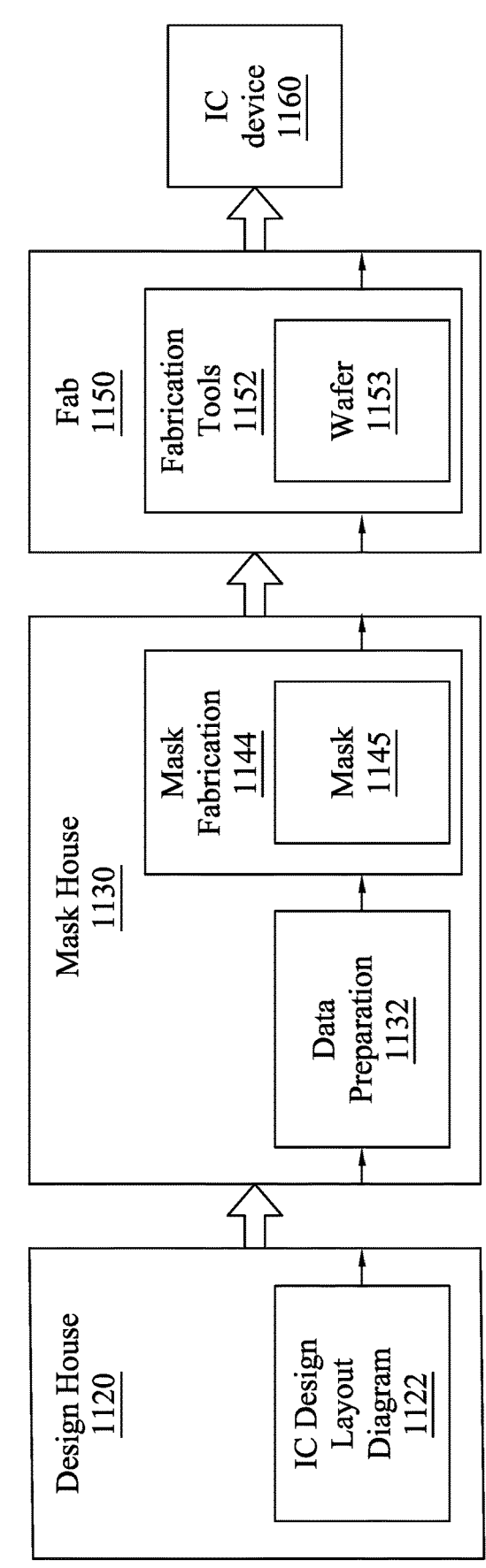
FIG. 7 is a block diagram of an IC manufacturing system, and an IC manufacturing flow associated therewith, in accordance with some embodiments.

FIG. 7 is a block diagram of IC manufacturing system 1100, and an IC manufacturing flow associated therewith, in accordance with some embodiments. In some embodiments, based on an IC layout diagram, at least one of (A) one or more semiconductor masks or (B) at least one component in a layer of a semiconductor integrated circuit is fabricated using manufacturing system 1100.

In FIG. 7, IC manufacturing system 1100 includes entities, such as a design house 1120, a mask house 1130, and an IC manufacturer/fabricator ("fab") 1150, that interact with one another in the design, development, and manufacturing cycles and/or services related to manufacturing an IC device 1160. The entities in system 1100 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 1120, mask house 1130, and IC fab 1150 is owned by a single larger company. In some embodiments, two or more of design house 1120, mask house 1130, and IC fab 1150 coexist in a common facility and use common resources.

Design house (or design team) 1120 generates an IC design layout diagram 1122. IC design layout diagram 1122 includes various geometrical patterns, e.g., an IC layout diagram discussed above. The geometrical patterns correspond to patterns of metal, oxide, or semiconductor layers that make up the various components of IC device 1160 to be fabricated. The various layers combine to form various IC features. For example, a portion of IC design layout diagram 1122 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 1120 implements a proper design procedure to form IC design layout diagram 1122. The design procedure includes one or more of logic design, physical design or place and route. IC design layout diagram 1122 is presented in one or more data files having information of the geometrical patterns. For example, IC design layout diagram 1122 can be expressed in a GDSII file format or DFII file format.

Mask house 1130 includes data preparation 1132 and mask fabrication 1144. Mask house 1130 uses IC design layout diagram 1122 to manufacture one or more masks 1145 to be used for fabricating the various layers of IC device 1160 according to IC design layout diagram 1122. Mask house 1130 performs mask data preparation 1132, where IC design layout diagram 1122 is translated into a representative data file (RDF). Mask data preparation 1132 provides the RDF to mask fabrication 1144. Mask fabrication 1144 includes a mask writer. A mask writer converts the RDF to an image on a substrate, such as mask (reticle) 1145 or a semiconductor wafer 1153. The design layout diagram 1122 is manipulated by mask data preparation 1132 to comply with particular characteristics of the mask writer and/or requirements of IC fab 1150. In FIG. 7, mask data preparation 1132 and mask fabrication 1144 are illustrated as separate elements. In some embodiments, mask data preparation 1132 and mask fabrication 1144 can be collectively referred to as mask data preparation.

In some embodiments, mask data preparation 1132 includes optical proximity correction (OPC) which uses lithography enhancement techniques to compensate for image errors, such as those that can arise from diffraction, interference, other process effects and the like. OPC adjusts IC design layout diagram 1122. In some embodiments, mask data preparation 1132 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 1132 includes a mask rule checker (MRC) that checks the IC design layout diagram 1122 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 1122 to compensate for limitations during mask fabrication 1144, which may undo part of the modifications performed by OPC in order to meet mask creation rules.

In some embodiments, mask data preparation 1132 includes lithography process checking (LPC) that simulates processing that will be implemented by IC fab 1150 to fabricate IC device 1160. LPC simulates this processing based on IC design layout diagram 1122 to create a simulated manufactured device, such as IC device 1160. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 1122.

It should be understood that the description of mask data preparation 1132 has been simplified for the purposes of clarity. In some embodiments, data preparation 1132 includes additional features such as a logic operation (LOP) to modify the IC design layout diagram 1122 according to manufacturing rules. Additionally, the processes applied to IC design layout diagram 1122 during data preparation 1132 may be executed in a variety of different orders.

After mask data preparation 1132 and during mask fabrication 1144, a mask 1145 or a group of masks 1145 are fabricated based on the modified IC design layout diagram 1122. In some embodiments, mask fabrication 1144 includes performing one or more lithographic exposures based on IC design layout diagram 1122. In some embodiments, an electron-beam (e-beam) or a mechanism of multiple e-beams is used to form a pattern on a mask (photomask or reticle) 1145 based on the modified IC design layout diagram 1122. Mask 1145 can be formed in various technologies. In some embodiments, mask 1145 is formed using binary technology. In some embodiments, a mask pattern includes opaque regions and transparent regions. A radiation beam, such as an ultraviolet (UV) or EUV beam, used to expose the image sensitive material layer (e.g., photoresist) which has been coated on a wafer, is blocked by the opaque region and transmits through the transparent regions. In one example, a binary mask version of mask 1145 includes a transparent substrate (e.g., fused quartz) and an opaque material (e.g., chromium) coated in the opaque regions of the binary mask. In another example, mask 1145 is formed using a phase shift technology. In a phase shift mask (PSM) version of mask 1145, various features in the pattern formed on the phase shift mask are configured to have proper phase difference to enhance the resolution and imaging quality. In various examples, the phase shift mask can be attenuated PSM or alternating PSM. The mask(s) generated by mask fabrication 1144 is used in a variety of processes. For example, such a mask(s) is used in an ion implantation process to form various doped regions in semiconductor wafer 1153, in an etching process to form various etching regions in semiconductor wafer 1153, and/or in other suitable processes.

IC fab 1150 is an IC fabrication business that includes one or more manufacturing facilities for the fabrication of a variety of different IC products. In some embodiments, IC Fab 1150 is a semiconductor foundry. For example, there may be a manufacturing facility for the front-end fabrication of a plurality of IC products (front-end-of-line (FEOL) fabrication), while a second manufacturing facility may provide the back end fabrication for the interconnection and packaging of the IC products (back-end-of-line (BEOL)

fabrication), and a third manufacturing facility may provide other services for the foundry business.

IC fab 1150 includes wafer fabrication tools 1152 configured to execute various manufacturing operations on semiconductor wafer 1153 such that IC device 1160 is fabricated in accordance with the mask(s), e.g., mask 1145. In various embodiments, fabrication tools 1152 include one or more of a wafer stepper, an ion implanter, a photoresist coater, a process chamber, e.g., a CVD chamber or LPCVD furnace, a CMP system, a plasma etch system, a wafer cleaning system, or other manufacturing equipment capable of performing one or more suitable manufacturing processes as discussed herein.

IC fab 1150 uses mask(s) 1145 fabricated by mask house 1130 to fabricate IC device 1160. Thus, IC fab 1150 at least indirectly uses IC design layout diagram 1122 to fabricate IC device 1160. In some embodiments, semiconductor wafer 1153 is fabricated by IC fab 1150 using mask(s) 1145 to form IC device 1160. In some embodiments, the IC fabrication includes performing one or more lithographic exposures based at least indirectly on IC design layout diagram 1122. Semiconductor wafer 1153 includes a silicon substrate or other proper substrate having material layers formed thereon. Semiconductor wafer 1153 further includes one or more of various doped regions, dielectric features, multi-level interconnects, and the like (formed at subsequent manufacturing steps).

According to some embodiments, a method for generating an integrated circuit (IC) layout is provided. The method includes providing an active region in a first layer of the IC layout, disposing a gate on the active area in a second layer extending in a first direction, disposing a first conductive segment on the active area in a third layer extending in a second direction perpendicular to the first direction, and disposing a second conductive segment on the first conductive segment in a fourth layer extending in the second direction. The second conductive segment electrically connects to the first conductive segment, and a width of the first conductive segment is different than a width of the second conductive segment.

According to another embodiment, a method for generating an integrated circuit (IC) layout is provided. The method includes providing an active region in a first layer of the IC layout, disposing a first conductive segment and a second conductive segment on the active area in a third layer extending in a second direction perpendicular to the first direction, wherein the second conductive segment is aligned with the first conductive segment, disposing a third conductive segment on the first conductive segment and the second conductive segment in a fourth layer extending in the second direction. The third conductive segment connects the first conductive segment to the second conductive segment, and a width of the first conductive segment is different than a width of the third conductive segment.

According to other embodiments, a semiconductor device is provided. The semiconductor device includes an active area, a gate on the active area extending in a first direction, a first conductive segment on the active area extending in a second direction perpendicular to the first direction, a second conductive segment level with the first conductive segment, wherein the second conductive segment is aligned with the first conductive segment, and a third conductive segment on the first conductive segment and the second conductive segment extending in the second direction, wherein the third conductive segment connects the first conductive segment to the second conductive segment.

The methods and features of the present disclosure have been sufficiently described in the above examples and descriptions. It should be understood that any modifications or changes without departing from the spirit of the present disclosure are intended to be covered in the protection scope of the present disclosure.

Moreover, the scope of the present application in not intended to be limited to the particular embodiments of the process, machine, manufacture, and composition of matter, means, methods and steps described in the specification. As those skilled in the art will readily appreciate from the present disclosure, processes, machines, manufacture, composition of matter, means, methods or steps presently existing or later to be developed, that perform substantially the same function or achieve substantially the same result as the corresponding embodiments described herein, may be utilized according to the present disclosure.

Accordingly, the appended claims are intended to include within their scope: processes, machines, manufacture, compositions of matter, means, methods or steps. In addition, each claim constitutes a separate embodiment, and the combination of various claims and embodiments are within the scope of the present disclosure.

What is claimed is:

1. A method for generating an integrated circuit (IC) layout, comprising:
   providing an active region in a first layer of the IC layout;
   disposing a gate on the active area in a second layer extending in a first direction;
   disposing a first conductive segment on the active area in a third layer, the first conductive segment extending in a second direction perpendicular to the first direction in a top view; and
   disposing a second conductive segment on the first conductive segment in a fourth layer, the second conductive segment extending in the second direction in the top view,
   wherein the second conductive segment electrically connects to the first conductive segment, and wherein a width of the first conductive segment is different than a width of the second conductive segment.

2. The method of claim 1, further comprising:
   disposing a third conductive segment in the third layer extending in the second direction, wherein the third conductive segment is aligned with the first conductive segment.

3. The method of claim 2, wherein the second conductive segment connects the first conductive segment to the third conductive segment through a conductive via between the third layer and the fourth layer.

4. The method of claim 1, wherein a projection of the first conductive segment on the active area partially overlaps with a projection of the gate on the active area.

5. The method of claim 1, wherein the width of the second conductive segment is greater than the width of the first conductive segment.

6. The method of claim 5, wherein the width of the second conductive segment is in a range of 1.5 to 2.5 times the width of the first conductive segment.

7. The method of claim 1, further comprising:
   disposing a fourth conductive segment in the fourth layer extending in the first direction.

8. The method of claim 7, wherein the second conductive segment is spaced apart from the fourth conductive segment by a distance.

9. The method of claim 8, wherein the distance is in a range of 1.0 to 1.5 times a width of the fourth conductive segment.

10. A method for generating an integrated circuit (IC) layout, comprising:

proviiding an active area in a first layer of the IC layout;

disposing a gate on the active area in a second layer extending in a first direction;

disposing a first conductive segment and a second conductive segment on the active area in a third layer, the first conductive segment and the second conductive segment extending in a second direction perpendicular to the first direction in a top view, wherein the second conductive segment is aligned with the first conductive segment;

disposing a third conductive segment on the first conductive segment and the second conductive segment in a fourth layer, the third conductive segment extending in the second direction in the top view;

wherein the third conductive segment connects the first conductive segment to the second conductive segment, and wherein a width of the first conductive segment is different than a width of the third conductive segment.

11. The method of claim 10, further comprising:

disposing a first conductive via and a second conductive via between the third layer and the fourth layer, wherein the first conductive via connects the third conductive segment to the first conductive segment, and the second conductive via connects the third conductive segment to the second conductive segment.

12. The method of claim 10, wherein a projection of the first conductive segment on the active area partially overlaps with a projection of the gate on the active area.

13. The method of claim 10, wherein the width of the third conductive segment is greater than the width of the first conductive segment.

14. The method of claim 13, wherein the width of the third conductive segment is in a range of 1.5 to 2.5 times the width of the first conductive segment.

15. The method of claim 10, further comprising:

disposing a fourth conductive segment in the fourth layer extending in the first direction.

16. The method of claim 15, wherein the third conductive segment is spaced apart from the fourth conductive segment by a first distance.

17. The method of claim 16, wherein the first distance is in a range of 1.0 to 1.5 times a width of the fourth conductive segment.

18. A method for generating an integrated circuit (IC) layout, comprising:

providing an active region in a first layer of the IC layout;

disposing a gate on the active area in a second layer extending in a first direction;

disposing a first conductive segment on the active area in a third layer, the first conductive segment extending in a second direction perpendicular to the first direction in a top view; and disposing a second conductive segment on the first conductive segment in a fourth layer, the second conductive segment extending in the second direction and aligned with the first conductive segment in the top view, wherein the second conductive segment connects to the first conductive segment, and wherein a width of the first conductive segment is different than a width of the second conductive segment.

19. The method of claim 18, wherein the width of the second conductive segment is greater than the width of the first conductive segment.

20. The method of claim 18, further comprising:

disposing a third conductive segment in the fourth layer extending substantially perpendicular to the second conductive segment.

\* \* \* \* \*